(12) United States Patent
Okuzawa et al.

(10) Patent No.: US 9,450,006 B2
(45) Date of Patent: Sep. 20, 2016

(54) IMAGE PICKUP ELEMENT, IMAGE PICKUP APPARATUS, AND IMAGE PICKUP SYSTEM

(71) Applicant: CANON KABUSHIKI KAISHA, Tokyo (JP)

(72) Inventors: Masahiko Okuzawa, Kamakura (JP); Takeshi Ogawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/948,810

(22) Filed: Nov. 23, 2015

(65) Prior Publication Data
US 2016/0079295 A1    Mar. 17, 2016

Related U.S. Application Data

(62) Division of application No. 14/087,752, filed on Nov. 22, 2013, now Pat. No. 9,224,776.

(30) Foreign Application Priority Data

Nov. 29, 2012    (JP) .................................. 2012-261605

(51) Int. Cl.
| | | |
|---|---|---|
| *H01L 27/146* | (2006.01) | |
| *H04N 5/232* | (2006.01) | |
| *H04N 5/369* | (2011.01) | |
| *H04N 9/04* | (2006.01) | |

(52) U.S. Cl.
CPC ... *H01L 27/14627* (2013.01); *H01L 27/14605* (2013.01); *H01L 27/14623* (2013.01); *H01L 27/14641* (2013.01); *H04N 5/23212* (2013.01); *H04N 5/3696* (2013.01); *H04N 9/045* (2013.01); *H01L 27/14603* (2013.01)

(58) Field of Classification Search
USPC ...................................................... 250/208.1
See application file for complete search history.

(56) References Cited

U.S. PATENT DOCUMENTS

| | | | | |
|---|---|---|---|---|
| 7,244,920 | B2 * | 7/2007 | Kim | ................... H01L 27/14603 |
| | | | | 250/208.1 |
| 8,531,567 | B2 * | 9/2013 | Roy | ................... H01L 27/14603 |
| | | | | 348/296 |
| 8,633,524 | B2 * | 1/2014 | Nomoto | ............ H01L 27/14603 |
| | | | | 257/292 |
| 9,224,776 | B2 * | 12/2015 | Okuzawa | ........... H04N 5/23212 |

(Continued)

FOREIGN PATENT DOCUMENTS

| CN | 1901630 A | 1/2007 |
|---|---|---|
| CN | 101796821 A | 8/2010 |

(Continued)

OTHER PUBLICATIONS

The above documents were cited in an Aug. 3, 2016 Chinese Office Action, of which is enclosed with an English translation, that issued in Chinese Patent Application No. 201310628779.7.

*Primary Examiner* — Michael Osinski
(74) *Attorney, Agent, or Firm* — Cowan, Liebowitz & Latman, P.C.

(57) ABSTRACT

An image pickup element includes a first pixel, a second pixel, and a third pixel that share one microlens, a first boundary that is provided between the first pixel and the second pixel, and a second boundary that is provided between the first pixel and the third pixel, and when a charge amount of the first pixel is saturated, a first charge amount from the first pixel to the second pixel via the first boundary is larger than a second charge amount from the first pixel to the third pixel via the second boundary.

11 Claims, 9 Drawing Sheets

(56) References Cited

U.S. PATENT DOCUMENTS

| | | | |
|---|---|---|---|
| 9,299,739 B2* | 3/2016 | Kobayashi | H01L 31/02 |
| 2001/0054726 A1* | 12/2001 | Abe | H01L 27/14812 |
| | | | 257/292 |
| 2003/0085399 A1* | 5/2003 | Inagaki | H01L 27/14603 |
| | | | 257/53 |
| 2003/0136981 A1* | 7/2003 | Sugiyama | H01L 27/14603 |
| | | | 257/222 |
| 2003/0179310 A1 | 9/2003 | Irie | |
| 2005/0077588 A1* | 4/2005 | Kasuga | H01L 27/14843 |
| | | | 257/432 |
| 2005/0110093 A1* | 5/2005 | Altice | H01L 27/14609 |
| | | | 257/359 |
| 2006/0102938 A1* | 5/2006 | Park | H01L 27/14609 |
| | | | 257/292 |
| 2006/0180745 A1* | 8/2006 | Lee | H01L 27/14603 |
| | | | 250/214.1 |
| 2006/0223212 A1* | 10/2006 | Jang | H01L 27/14601 |
| | | | 438/48 |
| 2006/0289911 A1* | 12/2006 | Lee | H01L 27/14603 |
| | | | 257/292 |
| 2007/0046796 A1* | 3/2007 | McKee | H01L 27/14603 |
| | | | 348/294 |
| 2007/0064138 A1* | 3/2007 | Wada | H04N 5/335 |
| | | | 348/311 |
| 2007/0187734 A1* | 8/2007 | Adkisson | H01L 27/1463 |
| | | | 257/293 |
| 2008/0157012 A1* | 7/2008 | Tachino | G01S 17/89 |
| | | | 250/552 |
| 2008/0180554 A1* | 7/2008 | Kobayashi | H04N 5/367 |
| | | | 348/246 |
| 2009/0050943 A1* | 2/2009 | Mauritzson | H04N 5/343 |
| | | | 257/292 |
| 2009/0065826 A1 | 3/2009 | Hwang | |
| 2009/0250778 A1* | 10/2009 | Shimotsusa | H01L 27/1462 |
| | | | 257/432 |
| 2009/0302408 A1* | 12/2009 | Nakagawa | H01L 27/1462 |
| | | | 257/432 |
| 2010/0097508 A1* | 4/2010 | Yanagita | H01L 27/14603 |
| | | | 348/301 |
| 2010/0225793 A1* | 9/2010 | Matsuda | H01L 27/14621 |
| | | | 348/280 |
| 2010/0238332 A1* | 9/2010 | Watanabe | H04N 5/353 |
| | | | 348/300 |
| 2011/0019063 A1* | 1/2011 | Watanabe | H01L 27/14603 |
| | | | 348/340 |
| 2011/0108939 A1* | 5/2011 | Marty | H01L 27/1463 |
| | | | 257/432 |
| 2011/0127408 A1* | 6/2011 | Yanagita | H01L 27/14603 |
| | | | 250/208.1 |
| 2011/0128400 A1* | 6/2011 | Wakano | H01L 27/14609 |
| | | | 348/222.1 |
| 2011/0134298 A1* | 6/2011 | Aoyama | H01L 27/14609 |
| | | | 348/311 |
| 2011/0156104 A1* | 6/2011 | Yamaguchi | H01L 27/14603 |
| | | | 257/222 |
| 2011/0163362 A1* | 7/2011 | Park | H01L 27/14603 |
| | | | 257/292 |
| 2011/0187911 A1* | 8/2011 | Shinohara | H01L 27/14812 |
| | | | 348/308 |
| 2011/0205416 A1* | 8/2011 | Nishihara | H01L 27/14609 |
| | | | 348/300 |
| 2011/0233707 A1* | 9/2011 | Fukuro | H01L 27/14612 |
| | | | 257/435 |
| 2011/0234873 A1* | 9/2011 | Yamakawa | H01L 27/14603 |
| | | | 348/300 |
| 2011/0248371 A1* | 10/2011 | Matsumura | H01L 27/14612 |
| | | | 257/443 |
| 2011/0273597 A1* | 11/2011 | Ishiwata | H01L 27/14603 |
| | | | 348/272 |
| 2011/0298022 A1* | 12/2011 | Ha | H01L 27/14603 |
| | | | 257/291 |
| 2012/0211851 A1* | 8/2012 | Mori | H01L 27/14603 |
| | | | 257/432 |
| 2012/0241591 A1* | 9/2012 | Wan | H01L 27/1461 |
| | | | 250/208.1 |
| 2013/0009224 A1* | 1/2013 | Ohri | H01L 27/1461 |
| | | | 257/292 |
| 2013/0076934 A1* | 3/2013 | Maeda | H01L 27/14603 |
| | | | 348/222.1 |
| 2013/0087875 A1* | 4/2013 | Kobayashi | H01L 27/1461 |
| | | | 257/432 |
| 2013/0235276 A1* | 9/2013 | Ogawa | H04N 5/23212 |
| | | | 348/703 |
| 2014/0152884 A1* | 6/2014 | Choi | H01L 27/14609 |
| | | | 348/335 |
| 2014/0204251 A1* | 7/2014 | Ishida | H04N 5/23212 |
| | | | 348/294 |
| 2014/0211052 A1* | 7/2014 | Choi | H01L 27/14609 |
| | | | 348/297 |
| 2014/0306311 A1* | 10/2014 | Funao | H01L 27/1461 |
| | | | 257/432 |

FOREIGN PATENT DOCUMENTS

| | | |
|---|---|---|
| CN | 102053378 A | 5/2011 |
| JP | 2010-276712 A | 12/2010 |

* cited by examiner 903 902 901

IMAGE PICKUP ELEMENT, IMAGE PICKUP APPARATUS, AND IMAGE PICKUP SYSTEM

CROSS-REFERENCE TO RELATED APPLICATIONS

This application is a divisional of application Ser. No. 14/087,752, filed Nov. 22, 2013 the entire disclosure of which is hereby incorporated by reference.

BACKGROUND OF THE INVENTION

1. Field of the Invention

The present invention relates to an image pickup element that includes a plurality of pixels sharing one microlens.

2. Description of the Related Art

Previously, an image pickup apparatus that performs a focus detection based on a phase difference of two pupil-divided images obtained from an image pickup element including a plurality of pixels sharing one microlens has been known. Japanese Patent Laid-open No. 2001-83407 discloses an image pickup apparatus that includes an image pickup element including the plurality of pixels sharing one microlens. The image pickup apparatus disclosed in Japanese Patent Laid-open No. 2001-83407 may obtain a high-quality image output by performing a focus detection based on a phase difference of two pupil-divided images obtained from the image pickup element and generating an image pickup signal using an added signal (added charge) of the plurality of pixels sharing one microlens.

However, in the image pickup apparatus disclosed in Japanese Patent Laid-open No. 2001-83407, when each of the divided pixels is saturated, the focus detection and the improvement in image quality may not be realized simultaneously.

BRIEF SUMMARY OF THE INVENTION

The present invention provides an image pickup element, an image pickup apparatus, and an image pickup system capable of achieving a focus detection and an improvement of an image quality simultaneously.

An image pickup element as one aspect of the present invention includes a first pixel, a second pixel, and a third pixel that share one microlens, a first boundary that is provided between the first pixel and the second pixel, and a second boundary that is provided between the first pixel and the third pixel, and when a charge amount of the first pixel is saturated, a first charge amount from the first pixel to the second pixel via the first boundary is larger than a second charge amount from the first pixel to the third pixel via the second boundary.

An image pickup element as another aspect of the present invention includes a first pixel and a second pixel that share a first microlens, a third pixel and a fourth pixel that share a second microlens, a first boundary that is provided between the first pixel and the second pixel, and a second boundary that is provided between the third pixel and the fourth pixel, and when charge amounts of the first pixel and the third pixel are saturated, a first charge amount from the first pixel to the second pixel via the first boundary is larger than a second charge amount from the third pixel to the fourth pixel via the second boundary.

An image pickup apparatus as another aspect of the present invention includes the image pickup element and a processor configured to perform a correlation calculation based on a signal obtained from at least apart of a plurality of pixels of the image pickup element.

An image pickup system as another aspect of the present invention includes an image pickup optical system and the image pickup apparatus.

Further features and aspects of the present invention will become apparent from the following description of exemplary embodiments with reference to the attached drawings.

DETAILED DESCRIPTION OF THE PREFERRED EMBODIMENTS

Figure 1A:
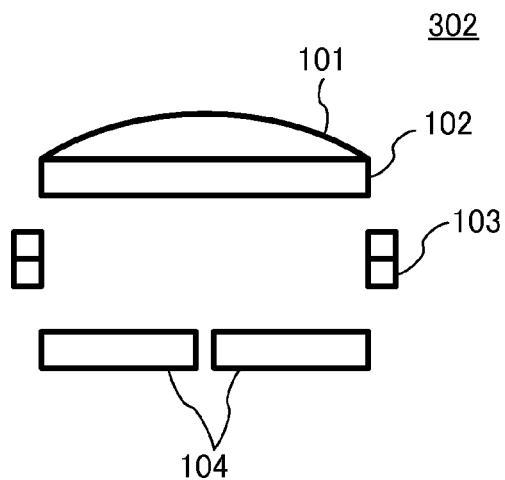
FIGS. 1A and 1B are configuration diagrams of an image pickup element in each of embodiments.

Hereinafter, exemplary embodiments of the present invention will be described with reference to the drawings. Furthermore, in the respective drawings, the same reference numerals will be given to the same components, and the description thereof will not be repeated.

Figure 3:
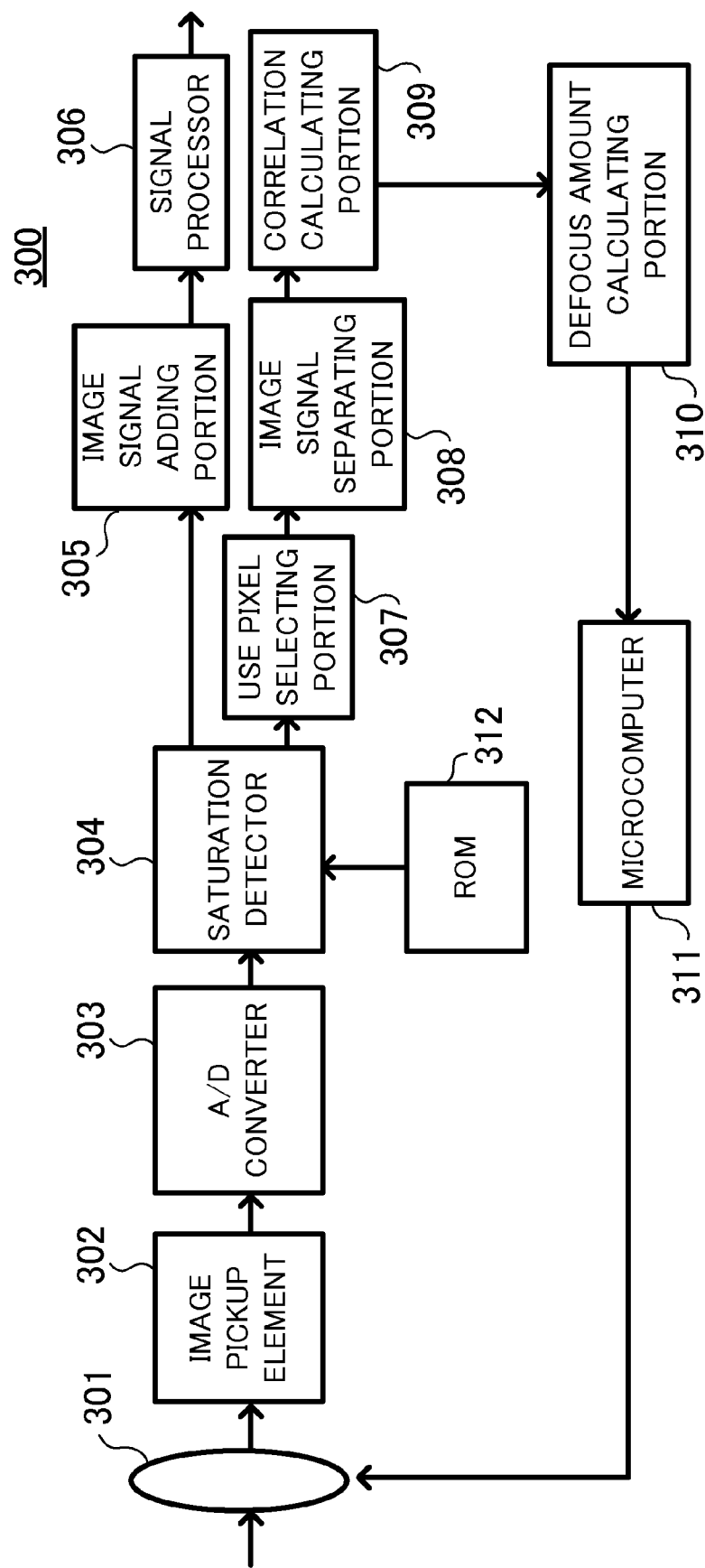
FIG. 3 is a block diagram illustrating a configuration of an image pickup apparatus in each of the embodiments.

First of all, referring to FIG. 3, a configuration of an image pickup apparatus 300 in the embodiment will be described. FIG. 3 is a block diagram illustrating the configuration of the image pickup apparatus 300. Reference numeral 301 denotes a lens unit (an image pickup optical system), reference numeral 302 denotes an image pickup element, reference numeral 303 denotes an A/D converter, and reference numeral 304 denotes a saturation detector. Reference numeral 305 denotes an image signal adding portion (an A-B image signal adding portion) which adds signals obtained from a plurality of pixels sharing one microlens. Reference numeral 306 denotes a signal processor which performs various kinds of signal processings for the added signal output from the image signal adding portion 305. The signal processor 306 outputs the image data, obtained by performing various kinds of signal processings, as a shot image.

Reference numeral 307 denotes a use pixel selecting portion (a non-saturated pixel selecting portion) which selects a non-saturated pixel so as to perform an AF control. Reference numeral 308 denotes an image signal separating portion (an A-B image signal separating portion) which separates an A-image and a B-image. The image signal separating portion 308 obtains two image signals different from each other. Reference numeral 309 denotes a correlation calculating portion (a processor). The correlation calculating portion 309 performs a correlation calculation based on the signal (an image signal) obtained from at least a part of the plurality of pixels of the image pickup element 302. Reference numeral 310 denotes a defocus amount calculating portion. Reference numeral 311 denotes a microcomputer (a controller) which controls an entire system of the image pickup apparatus 300, and reference numeral 312 denotes a ROM (a storage portion) which stores an individual difference of a saturation level.

The image pickup apparatus 300 of the present embodiment is configured by integrally including the lens unit 301 (an image pickup optical system), but the embodiment is not limited to this. The present embodiment can also be applied to an image pickup system that includes an image pickup apparatus body on which an image pickup optical system (a lens apparatus) is removably mounted and the image pickup optical system mounted on the image pickup apparatus body.

Figure 1B:
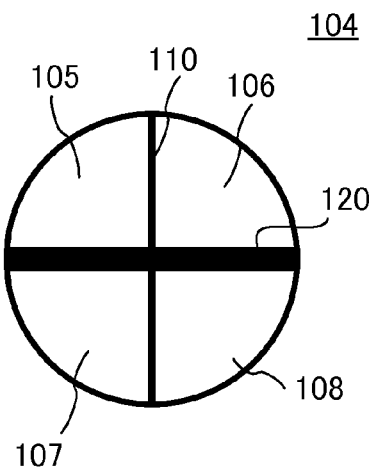

Next, referring to FIGS. 1A and 1B, the configuration of the image pickup element in the present embodiment will be described. FIGS. 1A and 1B are configuration diagrams of the image pickup element 302 in the present embodiment, and FIG. 1A is a cross-sectional view of a main part of the image pickup element 302 and FIG. 1B is a plan view of a light receiving portion 104.

In FIG. 1A, the microlens 101 efficiently collects light beams (incident light) onto the light receiving portion 104 (a photoelectric conversion portion). A color filter 102 causes only a light beam of a desired wavelength band of the incident light to be selectively transmitted therethrough. Reference numeral 103 denotes a wiring layer of a semiconductor (an image pickup element 302). The light beam passing through the color filter 102 is received by the light receiving portion 104 (a photodiode) and is photoelectrically converted.

Commonly, the image pickup element 302 includes one light receiving portion 104 (a photodiode) for one microlens 101. However, in the present embodiment, the light receiving portion 104 for one microlens 101 is divided into two portions so as to obtain a pupil-divided image. For example, in a case where a four-division light receiving portion (four-division pixels) that is divided into two portions in a horizontal direction and is divided into two portions in a vertical direction is provided as a multi-division light receiving portion, when two upper pixels are added and two lower pixels are added respectively, an image equivalent to a pupil-divided image obtained from two divided portions in the vertical direction can be obtained. On the other hand, when two left pixels are added and two right pixels are added in the four-division pixels respectively, an image equivalent to a pupil-divided image obtained by two divided portions in the vertical direction can be obtained. Accordingly, compared to the two-division pixels in the horizontal direction or the vertical direction, the pupil-divided image in both the vertical direction and the horizontal direction can be simultaneously obtained by the unit of one microlens 101.

As illustrated in FIG. 1B, the image pickup element 302 includes the four-division light receiving portion 104 (pixels 105 to 108) for one microlens 101. In the present embodiment, the pixels 105 to 108 include a first pixel, a second pixel, and a third pixel that share one microlens 101. Hereinafter, for convenience of the description, the pixels 106, 105, and 108 are referred to as the first pixel, the second pixel, and the third pixel, respectively, but the present invention is not limited to this.

The four-division light receiving portion 104 (the pixels) is provided with a boundary 110 that is configured to actively leak a charge to an adjacent pixel and a boundary 120 that is not configured to actively leak a charge when a charge amount of each pixel is saturated. The boundary 110 (a first boundary) is provided between the pixel 106 (a first pixel) and the pixel 105 (a second pixel) (and between the pixel 107 and the pixel 108). Furthermore, the boundary 120 (a second boundary) is provided between the pixel 106 (the first pixel) and the pixel 108 (a third pixel) (and between the pixel 105 and the pixel 107).

The boundary 110 is configured to allow a movement of a charge from the first pixel to the second pixel (for example, the pixel 105) when the charge amount of the first pixel (for example, the pixel 106) is saturated. On the other hand, the boundary 120 is configured to prevent the movement of the charge from the first pixel to the third pixel (for example, the pixel 108) when the charge amount of the first pixel (for example, the pixel 106) is saturated. That is, when the charge amount of the pixel 106 is saturated, the charge amount (a first charge amount) moving from the pixel 106 to the pixel 105 via the boundary 110 is larger than the charge amount (a second charge amount) moving from the pixel 106 to the pixel 108 via the boundary 120.

In the configuration illustrated in FIG. 1B, the correlation calculating portion 309 of FIG. 3 performs a correlation calculation in the vertical direction (a first direction) by using added charges between the pixel 106 (the first pixel) and the pixel 105 (the second pixel) and added charges between the pixels 107 and 108.

Figure 13A:
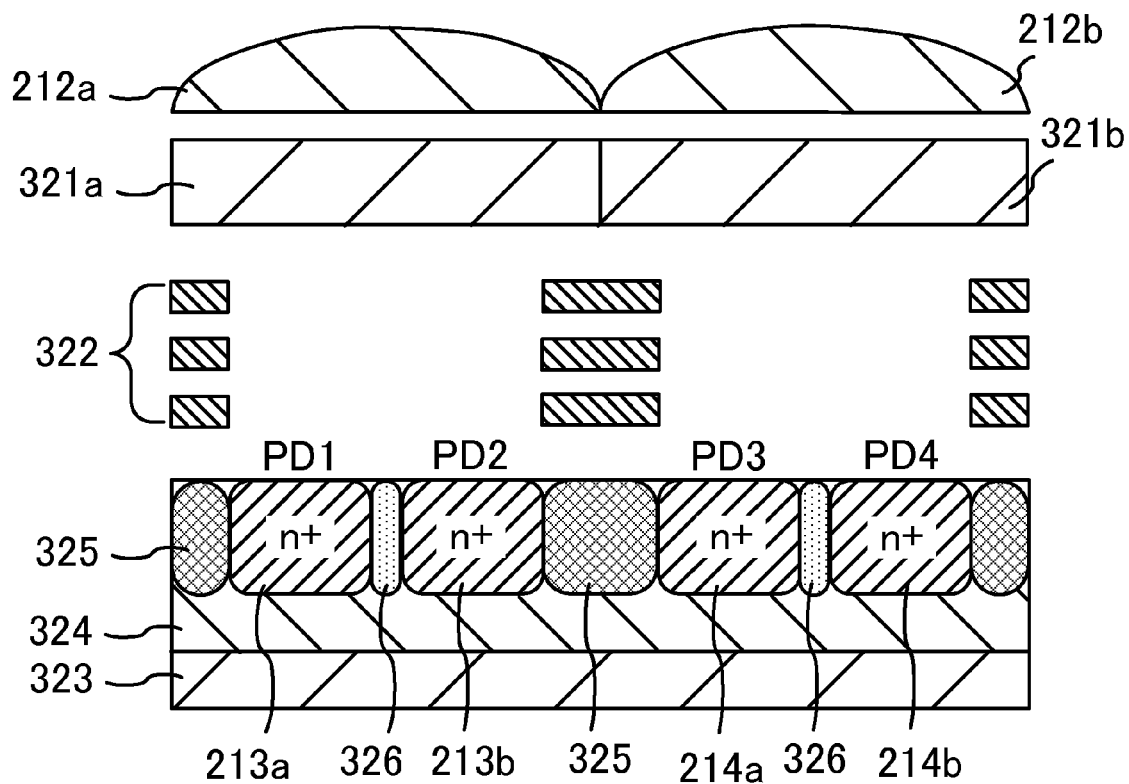
FIG. 13A is a cross-sectional view of a main part of the image pickup element and FIG. 13B is a schematic diagram of a potential in each of the embodiment.
Figure 13B:
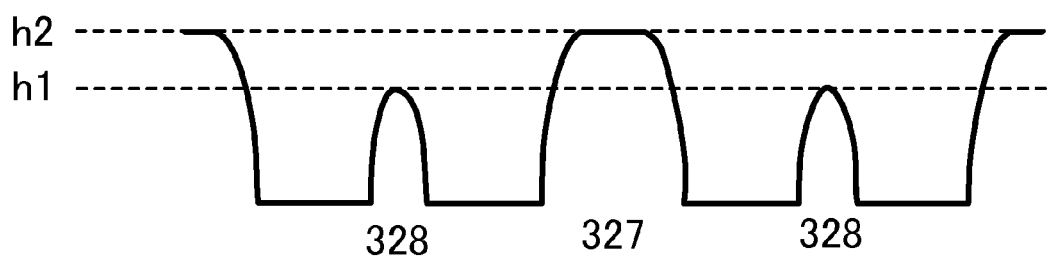

Next, referring to FIGS. 13A and 13B, an example of structures of the boundaries 110 and 120 will be described. FIG. 13A illustrates a cross-sectional structure of a main part of the image pickup element 302 of the present embodiment, and FIG. 13B is a schematic diagram illustrating a potential with respect to a signal charge of a semiconductor region of FIG. 13A. FIG. 13B illustrates four pixels (photoelectric conversion elements) corresponding to two adjacent microlenses 212a and 212b, but even in a configuration in which four pixels share one microlens, the description for the boundaries 110 and 120 may be applied.

In FIG. 13A, reference numerals 321a and 321b denote color filters. Reference numeral 322 denotes a wiring layer. In the embodiment, three wiring layers are disposed at different heights are illustrated. A P-type semiconductor region 324 and a plurality of N-type semiconductor regions 213 and 214 constitute a PN junction. The P-type semiconductor region 324 is disposed on a semiconductor region 323. The semiconductor region 323 is configured by using, for example, a P-type semiconductor substrate or an N-type semiconductor substrate.

The pixel (the photoelectric conversion element) includes the N-type semiconductor regions 213 and 214 and the P-type semiconductor region 324. Specifically, the P-type semiconductor region 324 and the N-type semiconductor regions 213a and 213b constitute two pixels (photoelectric conversion elements PD1 and PD2). The P-type semiconductor region 324 and the N-type semiconductor regions 214a and 214b constitute two pixels (photoelectric conversion elements PD3 and PD4). Each of the N-type semiconductor regions 213a, 213b, 214a, and 214b is a region in which the potential is low with respect to electrons, which is a region to collect signal charges. Furthermore, an embedded photodiode may also be configured by disposing the P-type semiconductor region on an incident surface side of each of the N-type semiconductor regions 213a, 213b, 214a, and 214b. The light beams which are collected by one microlens 212a enter the photoelectric conversion elements PD1 and PD2. The light beams which are collected by one microlens 212b enter the photoelectric conversion elements PD3 and PD4.

A P-type semiconductor region 326 is formed between the N-type semiconductor regions 213a and 213b included in each of the photoelectric conversion elements PD1 and PD2. The P-type semiconductor region 326 functions as a potential barrier with respect to electrons between the N-type semiconductor regions 213a and 213b. The P-type semiconductor region 326 corresponds to the boundary 110 of FIG. 1B.

The photoelectric conversion elements PD2 and PD3 are disposed so as to be adjacent to each other, but the light beams which are collected by the different microlenses 212a and 212b enter the respective photoelectric conversion elements PD2 and PD3. A P-type semiconductor region 325 is formed between the N-type semiconductor regions 213b and 214a included in each of the photoelectric conversion elements PD2 and PD3. The P-type semiconductor region 325 functions as a potential barrier with respect to electrons between the N-type semiconductor region 213b and the N-type semiconductor region 214a. The P-type semiconductor region 325 corresponds to the boundary 120 of FIG. 1B.

In the present embodiment, the impurity concentrations of the P-type semiconductor region 325 and the P-type semiconductor region 326 are set to be different from each other. Specifically, the P-type impurity concentration of the P-type semiconductor region 326 is lower than the P-type impurity concentration of the P-type semiconductor region 325. With such a concentration relation, the height of the potential barrier between the photoelectric conversion elements PD1 and PD2 can be lower than the height of the potential barrier between the photoelectric conversion elements PD2 and PD3.

As illustrated in FIG. 13B, the height of the potential barrier 327 between the photoelectric conversion elements PD1 and PD2 is indicated by h1. The height of the potential barrier 328 between the photoelectric conversion elements PD2 and PD3 is indicated by h2. The height h1 of the potential barrier between the photoelectric conversion elements PD1 and PD2 is lower than the height h2 of the potential barrier between the photoelectric conversion elements PD2 and PD3.

In the present embodiment, it is preferred that the P-type impurity concentration of the P-type semiconductor region 325 constituting the potential barrier 327 be set at least three times as high as the P-type impurity concentration of the P-type semiconductor region 326 constituting the potential barrier 328. According to such a configuration, it is possible to form substantially the same potential difference as the potential (about 26 mV at a room temperature of 27° C.) of the charge. More preferably, the impurity concentration is set ten times or more in consideration of the operation temperature range of the image pickup apparatus (the image pickup element 302).

In the present embodiment, the impurity concentration of the boundary 110 is set to be lower than the impurity concentration of the boundary 120, but the present embodiment is not limited to this, and for example, the same effect can be achieved by setting the width of the boundary 110 to be narrower than the width of the boundary 120.

Embodiment 1

Figure 2:
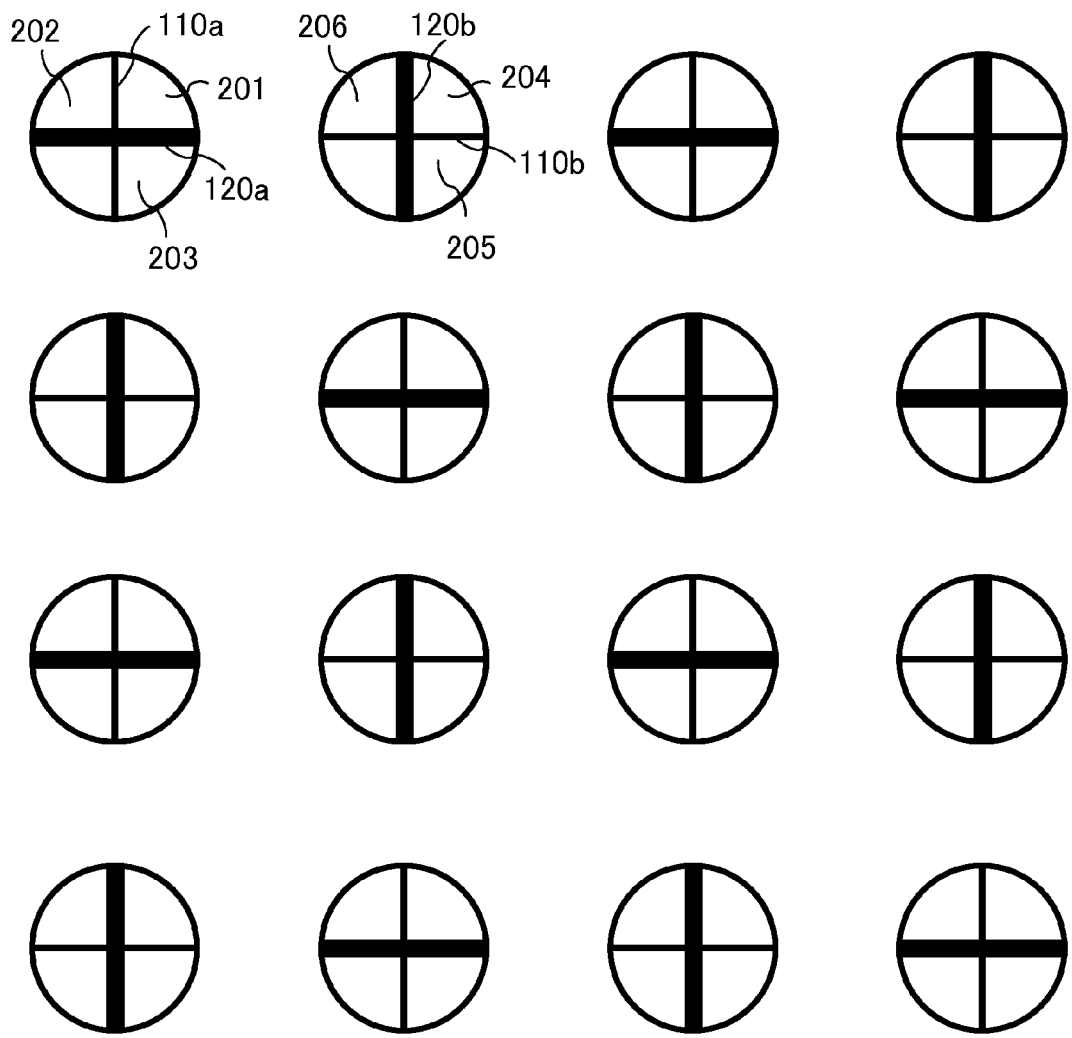
FIG. 2 is a diagram illustrating a pixel array of an image pickup element in Embodiment 1.

Next, an image pickup element in Embodiment 1 of the present invention will be described. FIG. 2 is a diagram illustrating a pixel array when the image pickup element of the embodiment is configured as a monochrome sensor. In the present embodiment, boundaries 110a and 120a corresponding to one microlens are alternately arranged in the horizontal direction and the vertical direction with respect to boundaries 110b and 120b corresponding to the adjacent microlens. That is, the image pickup element of the present embodiment is configured so that the charge leakage directions in the event of the saturation of the charge of the pixel are alternated in the horizontal direction and the vertical direction.

In the present embodiment, a first pixel (a pixel 201), a second pixel (a pixel 202), and a third pixel (a pixel 203) are provided so as to share one microlens. Furthermore, a fourth pixel (a pixel 204), a fifth pixel (a pixel 205), and a sixth pixel (a pixel 206) are provided so as to share the microlens adjacent to the one microlens. A third boundary (a boundary 110b) is formed between the fourth pixel (the pixel 204) and the fifth pixel (the pixel 205). Furthermore, a fourth boundary (a boundary 120b) is formed between the fourth pixel (the pixel 204) and the sixth pixel (the pixel 206).

For example, when a charge amount of the fourth pixel is saturated, a charge amount (a third charge amount) in which the charge moves from the fourth pixel to the fifth pixel via the third boundary is larger than a charge amount (a fourth charge amount) in which the charge moves from the fourth pixel to the sixth pixel via the fourth boundary. That is, when the charge amount of the fourth pixel is saturated, the third boundary is configured to allow the movement of the charge from the fourth pixel to the fifth pixel. Furthermore, when the charge amount of the fourth pixel is saturated, the fourth boundary is configured to prevent the movement of the charge from the fourth pixel to the sixth pixel. Then, the first boundary (the boundary 110a) and the third boundary (the boundary 110b) are provided in directions different from each other (the vertical direction or the horizontal direction). Similarly, the second boundary (the boundary 120a) and the fourth boundary (the boundary 120b) are provided in directions different from each other.

Figure 4:
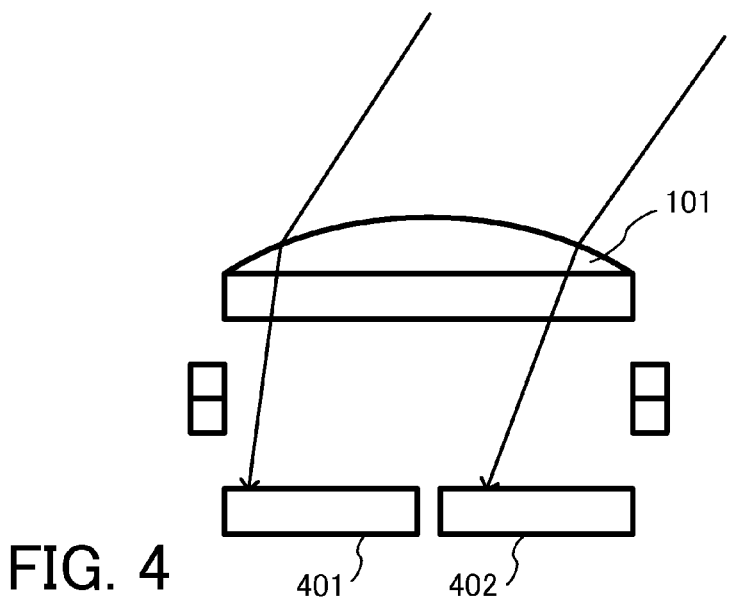
FIG. 4 is an explanatory diagram illustrating a case where pixels receive light beams at a high image height position in the image pickup element of Embodiment 1.

Subsequently, referring to FIG. 4, the saturation of the charge amount of the pixel will be described. FIG. 4 illustrates a state where light beams enter pixels 401 and 402 (light receiving portions) at a high image height position through the microlens 101. In FIG. 4, the center of the optical axis is located at the far right side of the pixels 401 and 402. Since the light beams generally enter the pixels while being inclined as it goes to the periphery of the image, the pixel 401 receives more light beams, but the pixel 402 scarcely receives light beams. For this reason, the pixel 401 (the charge amount of the pixel 401) reaches a saturation state earlier than the pixel 402 (the charge amount of the pixel 402).

<Saturated Pixel as One Pixel>

Figure 5:
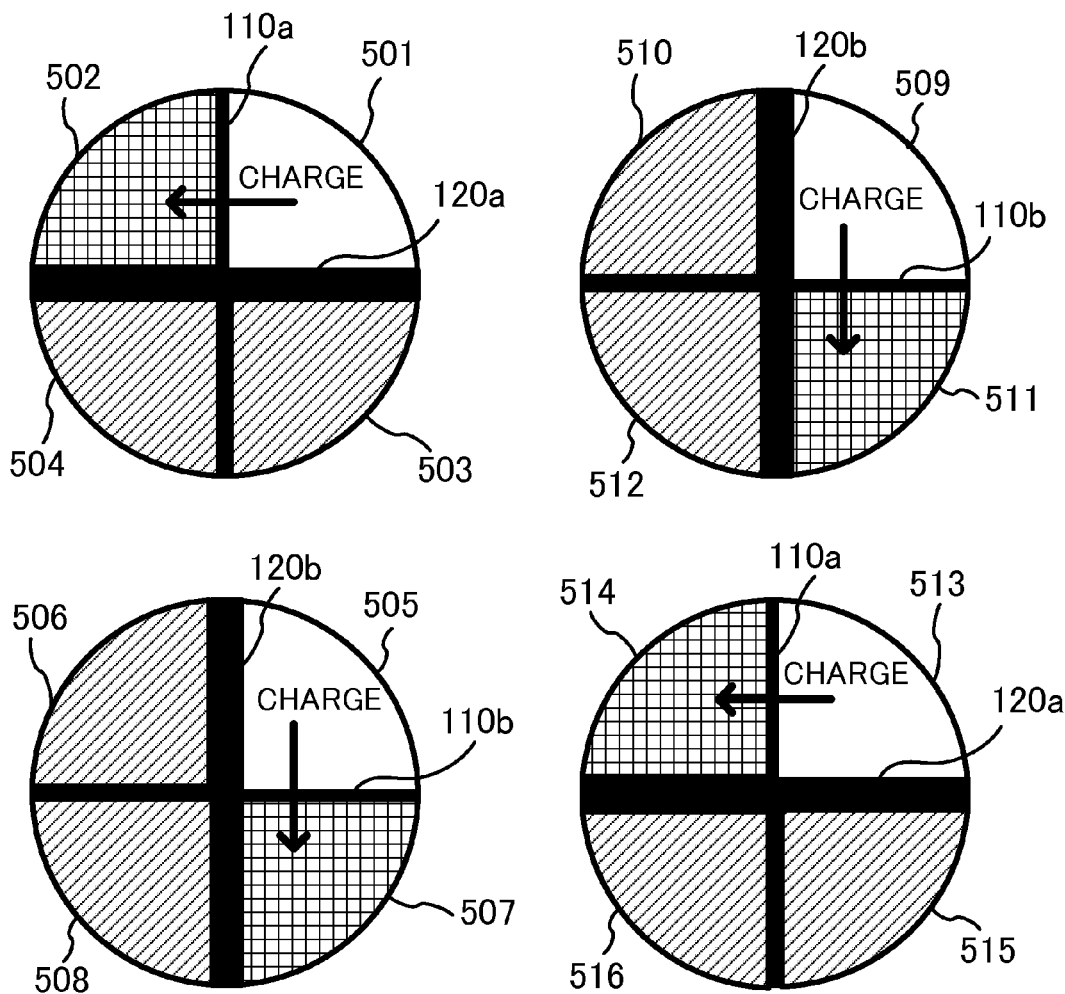
FIG. 5 is an explanatory diagram illustrating a case where a charge of one pixel corresponding to one microlens is saturated in the image pickup element of Embodiment 1.

Next, referring to FIG. 5, a case in which one pixel corresponding to one microlens is a saturated pixel (a right upper pixel is saturated) in the image pickup element having the pixel array illustrated in FIG. 2 will be described. FIG. 5 is an explanatory diagram illustrating a case where the charge of one pixel corresponding to one microlens is saturated.

In FIG. 5, each of pixels 501, 505, 509, and 513 is saturated. The charge accumulated in the saturated pixel 501 leaks to the pixel 502 indicated by the mesh line via the boundary 110a. On the other hand, the charge of the pixel 501 does not leak to the pixel 503 (and the pixel 504) indicated by the diagonal line due to the existence of the boundary 120a.

In this case, the charge leaking from the saturated pixel 501 leaks to the pixel 502, but total charges (a charge amount) of the pixel 501 and the pixel 502 are maintained without any loss (hereinafter, this state is called a "non-destructive state"). Further, the charges of the pixel 503 and the pixel 504 are not saturated, and there is no influence of the charge leaking from another pixel to the pixels 503 and 504. For this reason, the added charges that are obtained by adding the charges of the pixel 503 and the pixel 504 are also non-destructive. Accordingly, the focus detection can be performed by adding the charge amounts of two upper pixels and two lower pixels and obtaining the pupil-divided image in the vertical direction. In the embodiment, since the charge leaks in the horizontal direction, the added charges of the pixel 501 and the pixel 503 and the added charges of the pixel 502 and the pixel 504 are all destructive, and hence a correct pupil-divided image cannot be obtained from the pixels in the horizontal direction.

On the other hand, the charge of the pixel 505 leaks to a pixel 507 indicated by the mesh line, but does not leak to pixels 506 and 508 indicated by the diagonal line. The charge leaking from the saturated pixel 505 leaks to the pixel 507, but total charges (a charge amounts) of the pixels 505 and 507 are maintained without any loss. For this reason, the added charge amount of these two pixels is non-destructive. Further, the charges of the pixels 506 and 508 are not saturated, and there is no influence of the charge leaking from another pixel. For this reason, the added charge amount of the pixels 506 and 508 is also non-destructive. Accordingly, the focus detection can be performed by adding the charge amounts of the two right pixels and the two left pixels and obtaining the pupil-divided image in the horizontal direction. Further, since the charge leaks in the vertical direction, the added charge amount of the pixels 505 and 507 and the added charge amount of the pixels 506 and 508 are destructive, and hence a correct pupil-divided image cannot be obtained from these pixels in the vertical direction.

Similarly, the added charge amount of the pixels 509 and 511 and the added charge amount of the pixels 510 and 512 are non-destructive. Accordingly, the pupil-divided image of the horizontal direction and the vertical direction can be alternately obtained by the unit of the microlens, and the correlation calculation is performed from the pupil-divided image obtained as described above to calculate the defocus amount. That is, the pupil-divided image of the vertical direction is obtained from the pixels 501 to 504 and the pixels 513 to 516, the pupil-divided image of the horizontal direction is obtained from the pixels 505 to 508 and the pixels 509 to 512, and the respective correlation calculations are performed to calculate the defocus amount.

As described above, since the charge leakage directions are alternately set, even when one division pixel for one microlens is saturated, there is a direction in which the charge is destructive when the charges of the adjacent pixels are added in the adjacent microlens. For this reason, the pupil-divided image of the horizontal direction or the vertical direction can be obtained by alternating one microlens, and hence the focus detection can be performed. In this way, the correlation calculating portion 309 performs the correlation calculation in a first direction (the vertical direction) by using the added charges of the first pixel (for example, the pixel 501) and the second pixel (for example, the pixel 502). Further, the correlation calculating portion 309 performs the correlation calculation in a second direction (the horizontal direction) different from the first direction by using the added charges of the fourth pixel (for example, the pixel 505) and the fifth pixel (for example, the pixel 507).

Further, the information amount is halved, but the focus detection can be performed by obtaining the pupil-divided image of the vertical direction or the horizontal direction just using the pixel that exists in the portion indicated by the diagonal line of FIG. 5 and is not influenced by the leaked charge. Further, since the charge leaks, any loss does not occur in the charge amount of all division pixels. For this reason, when the charges of the division pixels are added, the division pixels can be used as the pixels having linearity, and hence the high image quality can be maintained.

<Saturated Pixel as Two Pixels>

Figure 6:
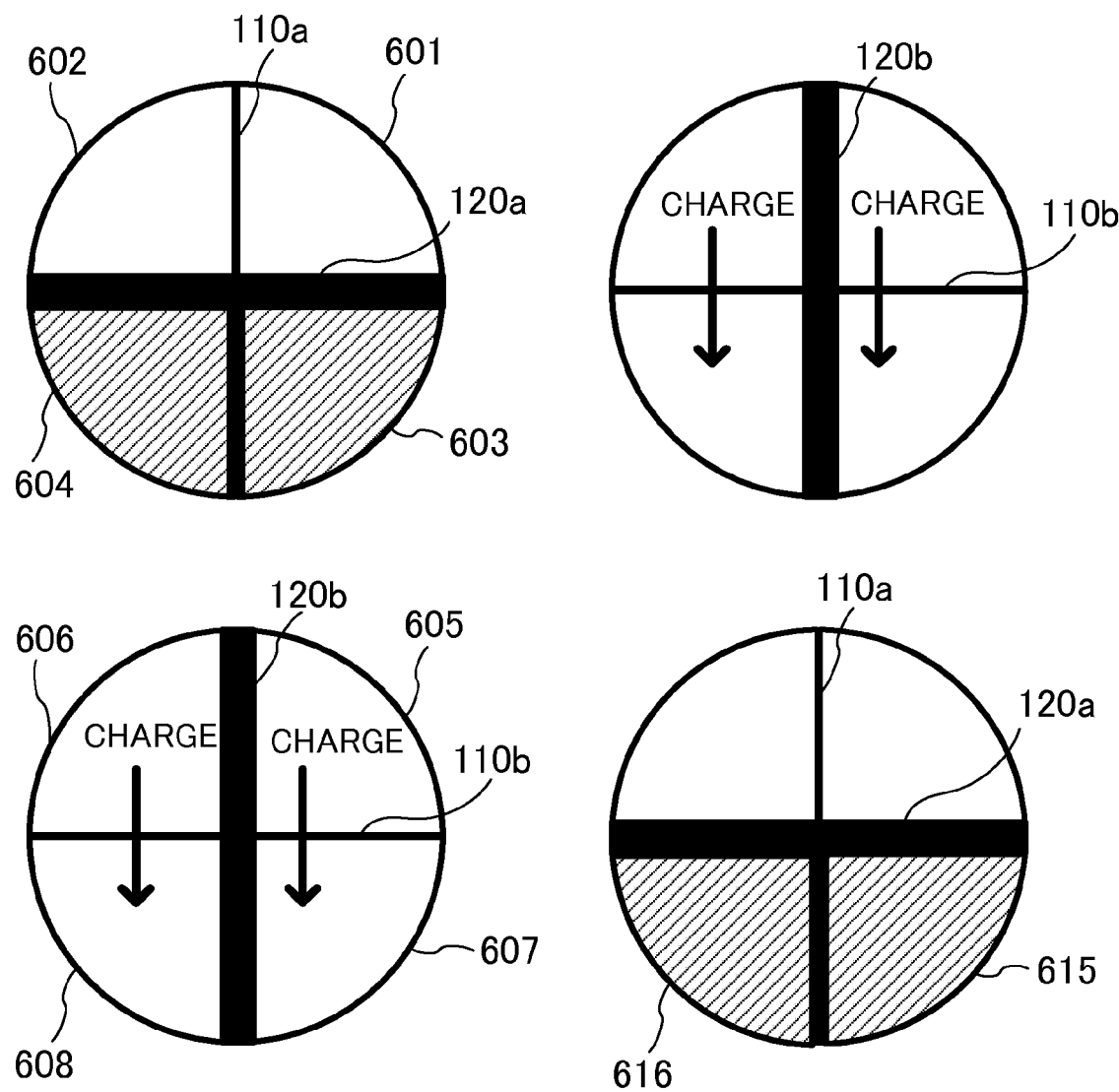
FIG. 6 is an explanatory diagram illustrating a case where charges of two pixels corresponding to one microlens are saturated in the image pickup element of Embodiment 1.

Next, referring to FIG. 6, a case in which two pixels corresponding to one microlens are saturated pixels (two upper pixels are saturated) in the image pickup element having the pixel array illustrated in FIG. 2 will be described. FIG. 6 is an explanatory diagram illustrating a case where the charges of two pixels corresponding to one microlens are saturated.

In FIG. 6, pixels 601 and 602 are saturated. However, since the boundary 120a is formed between a group of the pixels 601 and 602 and a group of pixels 603 and 604, the charge does not leak in upward and downward directions (the vertical direction). For this reason, the added charges of the pixels 601 and 602 are destructive, and hence the pupil-divided image of the vertical direction cannot be obtained. Further, the added charges of pixels 601 and 603 and the added charges of pixels 602 and 604 are also destructive, and hence the pupil-divided image of the horizontal direction cannot be obtained.

Further, pixels 605 and 606 are also saturated. However, since the boundary 110b is formed between a group of pixels 605 and 606 and a group of pixels 607 and 608, the charge leaks in the upward and downward directions (the vertical direction). For this reason, the added charges of pixels 605 and 607 and the added charges of pixels 606 and 608 are all non-destructive, and hence the pupil-divided image of the horizontal direction can be obtained. On the other hand, since the charges of the added pixel of the pixels 605 and 606 and the added pixel of the pixels 607 and 608 are destructive, the pupil-divided image of the vertical direction cannot be obtained. Similarly, pixels 615 and 616 indicated by the diagonal line are non-destructive. In this case, the defocus amount can be calculated by obtaining the pupil-divided image in the lateral direction (the horizontal direction) alternating one microlens and performing the correlation calculation.

In the image pickup element of the present embodiment, the boundaries 110a, 110b, 120a, and 120b are disposed so as to alternate the charge leakage directions. Then, when both charges of the first pixel (for example, the pixel 601) and the second pixel (for example, the pixel 602) are saturated, the correlation calculation of the second direction (for example, the vertical direction) is performed by using the added charges of the fourth pixel (for example, the pixel 605) and the fifth pixel (for example, the pixel 607). For this reason, even when two pixels sharing one microlens are saturated pixels, the pixel used for the focus detection in one direction (the horizontal direction) exists at a position alternating one microlens. For this reason, the focus detection can be performed only in one direction. Further, the information amount is halved, but the focus detection can be performed by obtaining the pupil-divided image of the vertical direction or the horizontal direction just using the pixel that exists in the portion indicated by the diagonal line of FIG. 6 and is not influenced by the leaked charge.

Subsequently, a method of using an image signal obtained from a plurality of pixels of the image pickup element as image data will be described. When the pixels 601 and 602 are saturated, a pixel for leaking the charges of the pixels 601 and 602 does not exist around the pixels 601 and 602. For this reason, the linearity of the added charges of the pixel 601 to 604 is not maintained. On the other hand, the saturated charges of the pixels 605 and 606 move to the lower pixels 607 and 608 adjacent to the pixels 605 and 606. For this reason, the linearity of the added charges of the pixels 605 to 608 is maintained.

In this way, according to the image pickup element of the present embodiment, a pixel where the linearity is maintained essentially exists at the pixels corresponding to the adjacent microlens. For this reason, a correction can be performed by estimating an original pixel value using the value of the peripheral non-destructive pixel. For example, at least a part of the charges of the saturated pixels 605 and 606 leak to the pixels 607 and 608, but total charges of a plurality of divided pixels 605 to 608 are not lost. For this reason, the added charges of the pixels 605 to 608 can be used as the image data.

Accordingly, since the added charges (an added pixel value) of the pixels 601 to 604 can be corrected by obtaining an average value of the added pixel value of, for example, the pixels corresponding to the adjacent upper, lower, left, and right microlenses, deterioration in image quality can be prevented. Furthermore, in the present embodiment, the average value of the usable added pixel value corresponding to the upper, lower, left, and right microlenses is used, but the correction method is not limited to this and another correction method may also be used. In the present embodiment, the plurality of pixels are disposed in a predetermined cycle repeated in the two-dimensional direction (the vertical direction and the horizontal direction), but the present embodiment is not limited to this, and for example, the plurality of pixels may also be disposed in a predetermined cycle repeated in a one-dimensional direction.

Embodiment 2

Figure 7:
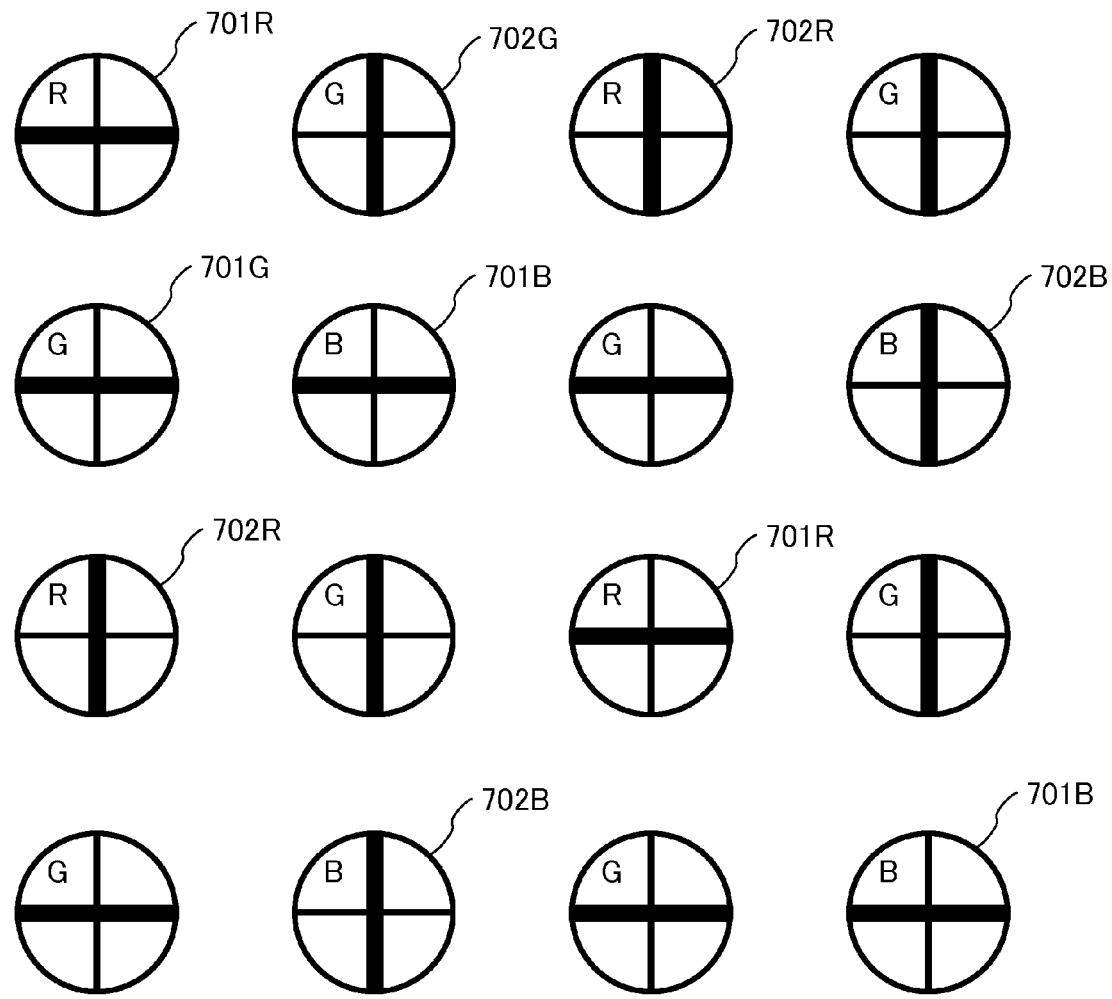
FIG. 7 is a diagram illustrating a pixel array of an image pickup element in Embodiment 2.
Figure 8A:
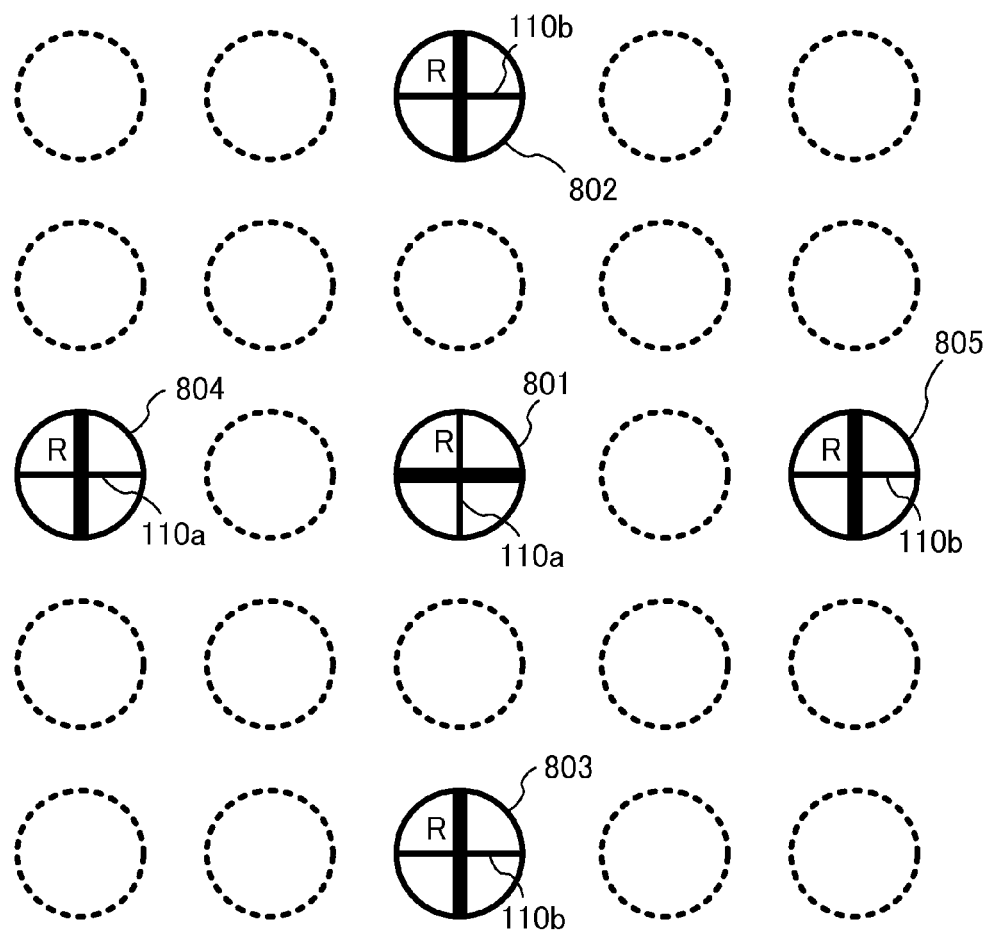
FIGS. 8A and 8B are diagrams illustrating an array of pixels having the same color in the image pickup element in Embodiment 2.
Figure 8B:
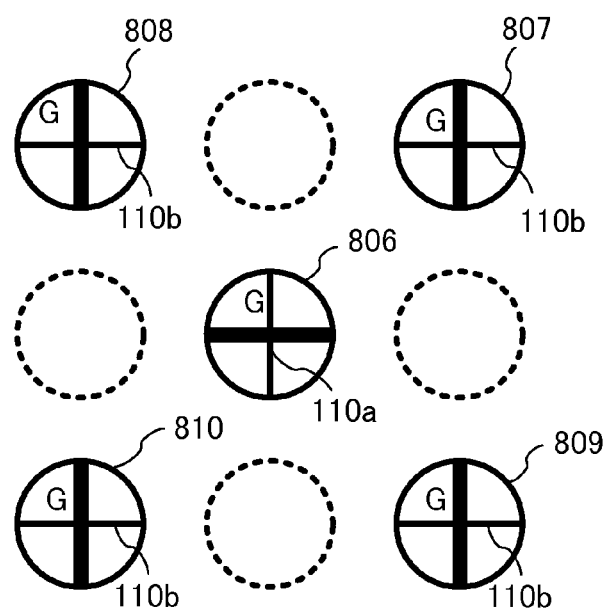

Next, referring to FIGS. 7, 8A, and 8B, an image pickup element in Embodiment 2 of the present invention will be described. FIG. 7 is a diagram illustrating a pixel array (Bayer array) of the image pickup element in the present embodiment. FIGS. 8A and 8B are diagrams illustrating an array of the pixels of the same color in the image pickup element, and FIG. 8A illustrates a R-pixel (a red pixel) and FIG. 8B illustrates a G-pixel (a green pixel).

The image pickup element illustrated in FIG. 7 includes four-division pixels for one microlens, and includes color filters of a plurality of colors (RGB). The color filters are arranged as a Bayer array by the unit of the microlens. The amount of the light beam received by the light receiving portion (the pixel) differs for each color filter. For this reason, the charge leakage directions are alternately disposed in the vertical direction and the horizontal direction between the nearest pixels having the same color. That is, as illustrated in FIG. 7, red pixels (R-pixels 701R and 702R) and blue pixels (B-pixels 701B and 702B) exist in the horizontal direction and the vertical direction so as to alternate one pixel.

As for the nearest pixels having the same color, the charge leakage directions (the boundaries 110a and 110b) are alternately disposed as illustrated in FIG. 8A. Further, green pixels (G-pixels 701G and 702G) are disposed so that two pixels are located obliquely within four pixels of two by two. Further, as illustrated in FIG. 8B, the charge leakage directions (boundaries 110a and 110b) are disposed so as be alternately changed between the nearest pixels. That is, the image pickup element of the present embodiment includes a first microlens corresponding to the color filter having one color among the color filters having the plurality of colors and a second microlens corresponding to the color filter having one color and adjacent to the first microlens involved with the color filter having one color. For example, in FIGS. 8A and 8B, the first microlens corresponds to the microlenses corresponding to a R-pixel 801 and a G-pixel 806. Further, the second microlens corresponds to the microlenses corresponding to R-pixels 802 to 805 and G-pixels 807 to 810. In this case, the first microlens is shared by the first pixel, the second pixel, and the third pixel, and the second microlens is shared by the fourth pixel, the fifth pixel, and the sixth pixel.

In the present embodiment, when the amount of the light beams received by the division pixels at the high image height region is biased so that a part of the division pixels are saturated, the focus detection can be performed for each pixel having the same color similarly to the method of Embodiment 1, and thus the image quality can be maintained. For example, when the right upper pixel of four pixels sharing one microlens is saturated, the charge of the R-pixel 801 (a red pixel) leaks in the horizontal direction, but the charges of the nearest pixels (R-pixels 802 to 805) leak in the vertical direction. In this case, the same method as that of Embodiment 1 can be used when only the R-pixels are considered. Regarding the R-pixel 801, the added charges of two adjacent pixels in the horizontal direction are not destructive. For this reason, the defocus amount of the vertical direction can be calculated by performing the focus detection using the two pixels. Further, the nearest pixels (R-pixels 802 to 805) of the R-pixel 801 become non-destructive pixels when adding the charges of two adjacent pixels in the vertical direction, and the defocus amount of the horizontal direction can be calculated by using the two pixels. Similarly, regarding the green pixels, the G-pixel 806 becomes a non-destructive pixel when the charges of two adjacent pixels in the horizontal direction are added. Further, the nearest pixels (G-pixels 807 to 810) of the G-pixel 806 become non-destructive pixels when the charges of two adjacent pixels in the vertical direction are added. Thus, the defocus amount can be calculated by obtaining the pupil-divided image of the vertical direction or the horizontal direction from these pixels.

In this way, as illustrated in FIG. 7, when the pixels are repeatedly arranged by four by four in the vertical direction and the horizontal direction, the AF precision can be maintained even when the division pixels are saturated at the high image height position. Further, since the linearity of the added charges obtained by adding the charges of four pixels sharing one microlens is maintained, the high image quality can be maintained. Furthermore, even when the saturated pixels are two pixels, this case is the same as that of Embodiment 1 when each color is considered as described above.

Embodiment 3

Next, referring to FIGS. 9 and 10, an image pickup element in Embodiment 3 of the present invention will be described. As described above, since the light beams are obliquely incident at a high image height position, for example, the focus detection can also be performed by increasing the number of the plurality of pixels (as four or more divided pixels) sharing one microlens and selectively using the pixels to which the light beams are appropriately incident.

Figure 9:
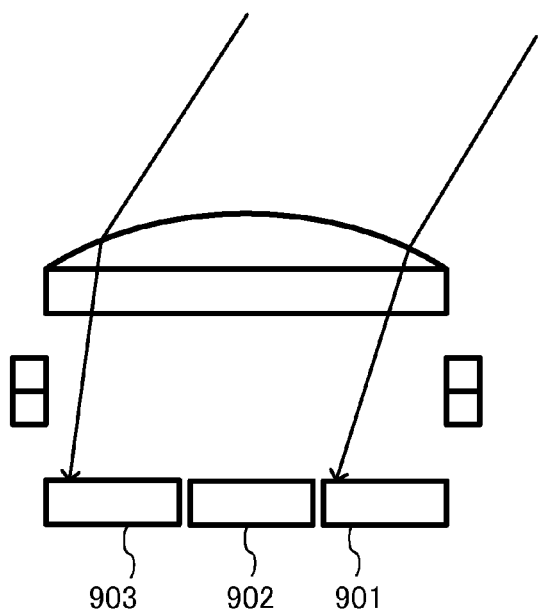
FIG. 9 is an explanatory diagram illustrating a case where pixels receive light beams at a high image height position in an image pickup element of Embodiment 3.

FIG. 9 is an explanatory diagram illustrating a case where pixels at a high image height position receive light beams in the image pickup element of the present embodiment. When the light beams are obliquely incident at a high image height position, the pixels that receive the light beams in a less biased state can be used by selecting pixels 902 and 903 that receive most of the light beams. The example illustrated in FIG. 9 is a schematic diagram of a left high image height position with respect to the center of the optical axis. Here, pixels 901 and 902 are selectively used when the high image height position is located at the right side of the center of the optical axis. Further, since the light beams are equivalently enter the division pixels in the vicinity of the center of the optical axis, the pixels 901 and 903 are selectively used. Furthermore, since the pixels used for the focus detection is away from the vicinity of the center of the optical axis, the base length is long and the focus detection precision is improved. On the other hand, when the image data (an image pickup signal) is obtained, the charges of all pixels sharing one microlens are added for the image data so as to maintain the linearity.

Figure 10:
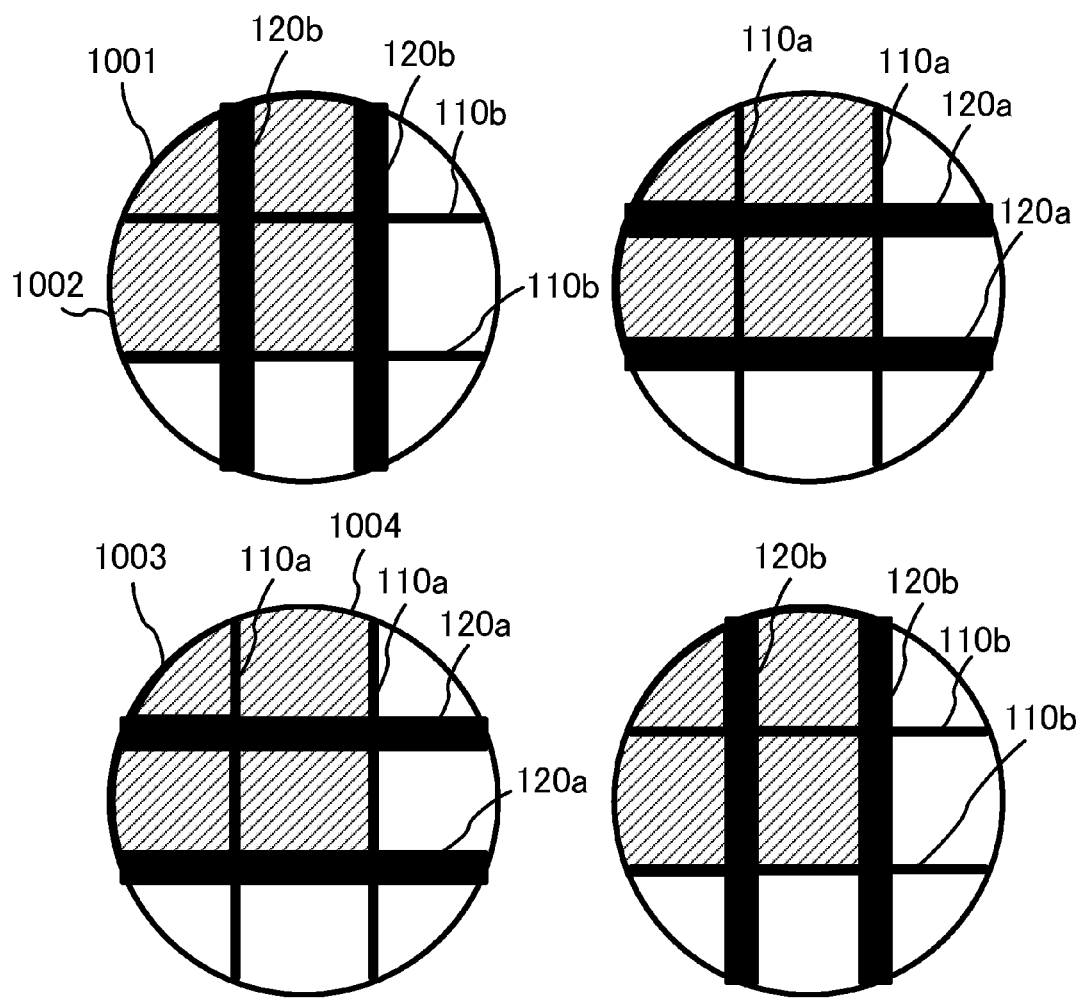
FIG. 10 is a diagram illustrating a pixel array of the image pickup element in Embodiment 3.

FIG. 10 is a diagram illustrating a pixel array of an image pickup element in the present embodiment. As illustrated in FIG. 10, the image pickup element of the embodiment includes pixels divided into nine pixels as three by three in the horizontal direction and the vertical direction for one microlens. In addition, the pixels are arranged so that the charge leakage directions (boundaries 110*a* and 110*b*) are periodically different directions (the vertical direction and the horizontal direction).

In the pixels located at a high image height position of the left upper side with respect to the center of the optical axis, the saturation of the charge easily occurs since the amount of the light beams incident to the left upper pixels among the nine-division pixels increases. When the charge of a left upper pixel 1001 among the nine-division pixels is saturated, the charge of the pixel 1001 leaks to an adjacent pixel 1002 via the boundary 110*b*, but does not leak to another adjacent pixel due to the existence of the boundary 120*b*. When the charge of a pixel 1003 is saturated, the charge of the pixel 1003 leaks to a pixel 1004 via the boundary 110*a*, but does not leak to another adjacent pixel due to the existence of the boundary 120*a*.

On the other hand, the amount of the light beams incident to the right lower pixels among the nine-division pixels is small. Accordingly, the focus detection may be performed by using four pixels which are located at the left upper position and to which the light beams are appropriately incident. In this case, the focus detection can be performed by the same method as that of Embodiment 1 when only four pixels are considered. That is, since a non-destructive pixel essentially exists in the neighboring pixels of the destructive pixel, the same method as that of Embodiment 1 can be applied. Further, the amount of the light beams incident to the right and the lower pixels is small, but the linearity as the image is not maintained when these pixels are not used. For this reason, the added charges of all the nine pixels are used as the image data (the image pickup signal).

In this way, in the present embodiment, the use pixel selecting portion 307 (a pixel selecting portion) selects the pixel used for the correlation calculation from the plurality of pixels sharing one microlens. Then, the correlation calculating portion 309 (a processor) performs the correlation calculation based on the signal obtained from the pixel selected by the use pixel selecting portion 307.

Even when two or more pixels among the plurality of pixels sharing one microlens are saturated, the same method as that of Embodiment 1 can be applied. That is, the focus detection is performed by using the signal from the non-destructive pixel, and the correction (the interpolation) is performed from the neighboring pixels when the linearity is not maintained due to the saturated charges of the pixel to be used as the image data (the image pickup signal).

In the present embodiment, a monochrome sensor (the image pickup element) is described. However, the present embodiment is not limited to this, and can also be applied to, for example, an image pickup element having color filters having three colors of a Bayer array. In this case, the method of the present embodiment can be applied in a manner such that the charge leakage direction is alternated for each of the adjacent pixels having the same color which is periodically disposed. In the present embodiment, the nine-division pixels sharing one microlens are described, but the present embodiment is not limited to this, and for example, the present embodiment can be applied to an arbitrary number of division pixels.

Embodiment 4

Figure 11A:
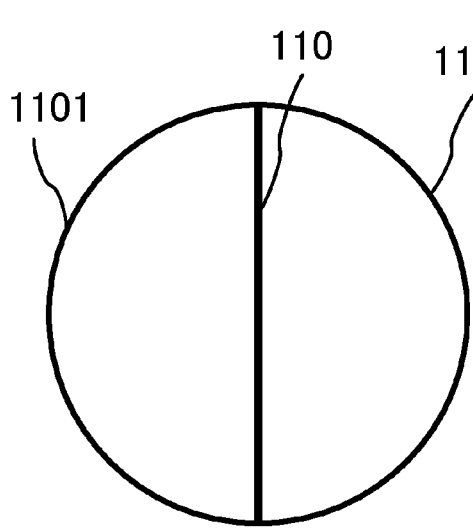
FIGS. 11A and 11B are diagrams illustrating a pixel array of an image pickup element in Embodiment 4.
Figure 11B:
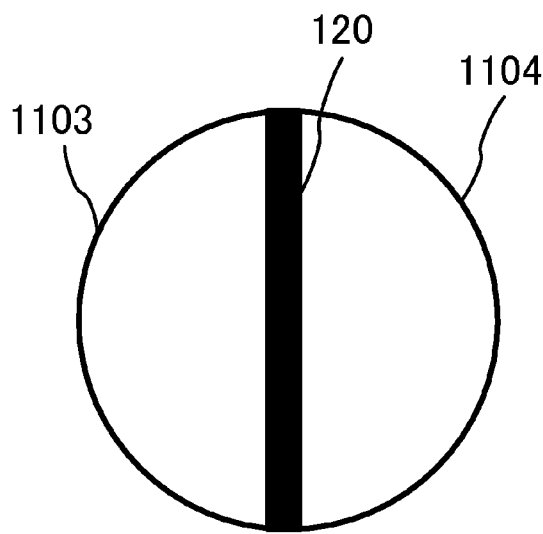

Next, referring to FIGS. 11A, 11B, and 12, an image pickup element in Embodiment 4 of the present invention will be described. FIGS. 11A and 11B are diagrams illustrating a pixel array of the image pickup element of the present embodiment, which illustrate a configuration in which each of two pixels sharing one microlens is divided into two pixels in the horizontal direction.

FIG. 11A illustrates a configuration of a first pixel (a pixel 1101) and a second pixel (a pixel 1102) sharing a first microlens. Further, the boundary 110 (a first boundary) is provided between the first pixel and the second pixel. As illustrated in FIGS. 13A and 13B, the boundary 110 has a structure in which the charge leaks between two pixels. FIG. 11B illustrates a configuration of a third pixel (a pixel 1103) and a fourth pixel (a pixel 1104) sharing a second microlens. Further, the boundary 120 (a second boundary) is provided between the third pixel and the fourth pixel. As illustrated in FIGS. 13A and 13B, the boundary 120 has a structure in which the charge does not leak (hardly leaks) between two pixels.

In this way, when the charge amount of the first pixel (for example, the pixel 1101) is saturated, the boundary 110 is configured to allow the movement of the charge from the first pixel to the second pixel. On the other hand, when the charge amount of the third pixel (for example, the pixel 1103) is saturated, the boundary 120 is configured to prevent the movement of the charge from the third pixel to the fourth pixel. That is, when the charge amounts of the first pixel and the third pixel are saturated, the first charge amount from the first pixel to the second pixel via the first boundary is larger than the second charge amount from the third pixel to the fourth pixel via the second boundary.

Figure 12:
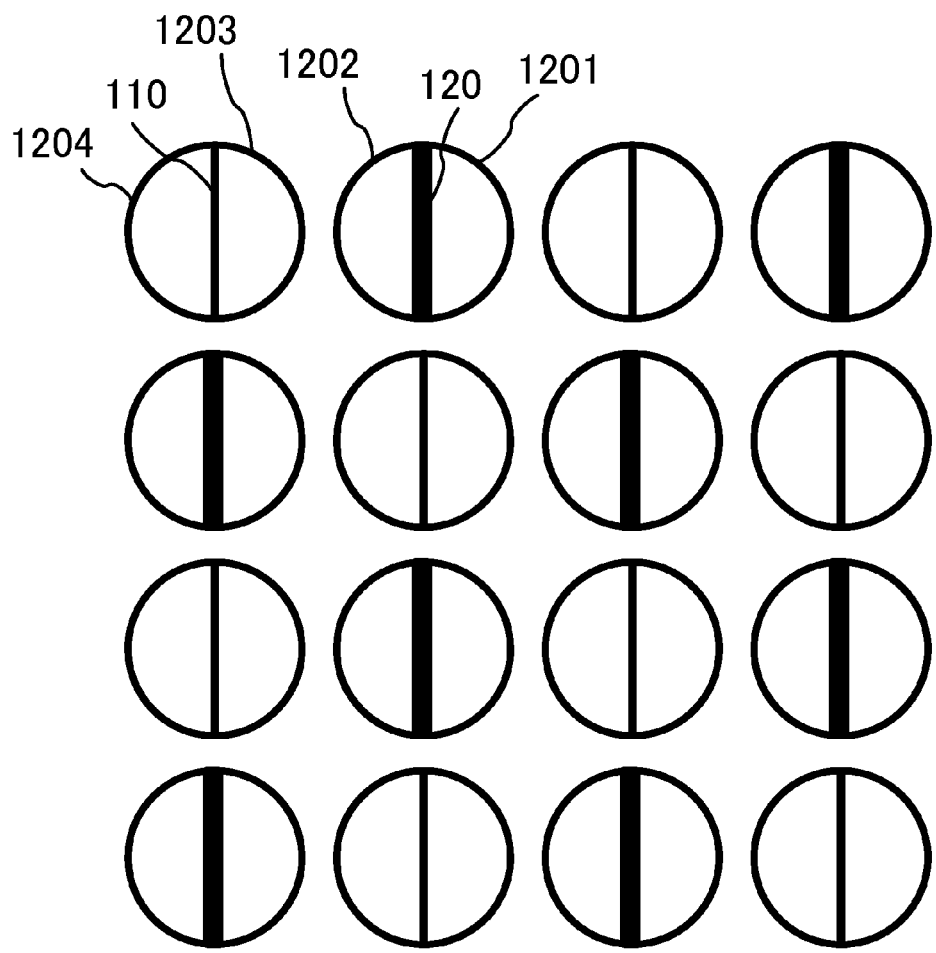
FIG. 12 is a diagram illustrating a pixel array of the image pickup element in Embodiment 4.

FIG. 12 illustrates a configuration in which two types of pixels (the first and second microlenses) illustrated in FIGS.

11A and 11B are alternately arranged two-dimensionally (in the vertical direction and the horizontal direction). As described above, the amount of the light beams received by the division pixels at a high image height region is biased, so that one of the division pixels is saturated. For example, when a right pixel 1201 of two division pixels is saturated, the charge of the pixel 1201 does not leak to a left pixel 1202. For this reason, the linearity of the added charges of the pixels 1201 and 1202 are not maintained. On the other hand, since a charge of a pixel 1203 leaks to a pixel 1204, the added charges of the pixels 1203 and 1204 are not lost, so that the linearity is maintained. In the present embodiment, the added charges of the pixels 1201 and 1202 are destructive, but the deterioration in image quality can be reduced by using the peripheral pixels (for example, the pixels 1203 and 1204) maintaining the linearity.

Since the pixel 1202 is a non-destructive pixel, an original charge of the pixel 1201 can be obtained by subtracting the charge amount of the pixel 1202 from the added charges (an estimated charge amount) of the pixels 1201 and 1202 estimated from the peripheral pixels. In this case, the saturation detector 304 or the image signal separating portion 308 (a charge estimating portion) estimates the charge of a target pixel. For example, when the charge of the third pixel (for example, the pixel 1202) or the fourth pixel (for example, the pixel 1201) is saturated, the charge of the third pixel or the fourth pixel is estimated by using the added charges of the first pixel (for example, the pixel 1204) and the second pixel (for example, the pixel 1203).

In this way, in the present embodiment, the pixels (pixels 1201 and 1202) that are divided via the boundary 120 for preventing the leakage of the charge exist periodically. For this reason, the AF control can be performed by using the pixels (pixels 1201 and 1202). Accordingly, since the plurality of pixels having different boundaries (boundaries 110 and 120) are repeatedly and periodically arranged, the AF control and the improvement in image quality can be simultaneously performed even when one of the division pixels is saturated.

According to each of the embodiments described above, even when a part of the pixels among the plurality of pixels sharing one microlens are saturated, the focus detection can be performed by using the usable pixels among the plurality of pixels. For this reason, an image pickup element, an image pickup apparatus, and an image pickup system capable of simultaneously achieving the focus detection and the improvement in image quality can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-261605, filed on Nov. 29, 2012, which is hereby incorporated by reference herein in its entirety.

What is claimed is:

1. An image pickup element comprising:
    four pixels which share one micro lens, the four pixels being divided into two portions in a first direction and being divided into two portions in a second direction different from the first direction;
    a first boundary provided between adjacent pixels in the first direction among the four pixels; and
    a second boundary provided between adjacent pixels in the second direction among the four pixels,
    wherein the first boundary and the second boundary are configured by a P-type semiconductor, and
    wherein a P-type impurity concentration of the first boundary is lower than that of the second boundary.
2. The image pickup element according to claim 1,
    wherein when a charge amount of a pixel of the four pixels is saturated according to light which the saturated pixel receives, the charge moves to at least one pixel adjacent to the pixel.
3. The image pickup element according to claim 1,
    wherein the first direction is a horizontal direction and the second direction is a vertical direction.
4. The image pickup element according to claim 1,
    wherein pixels are arranged as a Bayer array by the unit of the microlens.
5. An image pickup apparatus comprising:
    the image pickup element according to claim 1;
    and a generator configured to generate an image based on a signal obtained from at least one of the pixels of the image pickup element.
6. An image pickup element comprising:
    four pixels which share one microlens, the four pixels being divided into two portions in a first direction and being divided into two portions in a second direction different from the first direction;
    a first boundary provided between adjacent pixels in the first direction among the four pixels; and
    a second boundary provided between adjacent pixels in the second direction among the four pixels,
    wherein a first charge amount in which the charge moves between pixels via the first boundary is larger than a second charge amount in which the charge moves between pixels via the second boundary.
7. The image pickup element according to claim 6 further comprising:
    four pixels which share other microlens adjacent to the one microlens, the four pixels being divided into two portions in the first direction and being divided into two portions in the second direction,
    wherein for a charge amount moving via a boundary provided between adjacent pixels among the four pixels, a charge amount moving via a boundary in the second direction is larger than a charge amount moving via a boundary in the first direction.
8. The image pickup element according to claim 6,
    wherein when a charge amount of a pixel of the four pixels is saturated according to light which the pixel receives, the charge moves to at least one pixel adjacent to the pixel.
9. The image pickup element according to claim 6,
    wherein the first direction is a horizontal direction and the second direction is a vertical direction.
10. The image pickup element according to claim 6,
    wherein pixels are arranged as a Bayer array by the unit of the microlens.
11. An image pickup apparatus comprising:
    the image pickup element according to claim 6; and
    a generator configured to generate an image based on a signal obtained from at least one of the pixels of the image pickup element.

* * * * *